United States Patent
Kuroda et al.

(10) Patent No.: US 6,990,043 B2
(45) Date of Patent: Jan. 24, 2006

(54) SEMICONDUCTOR INTEGRATED CIRCUIT DEVICE HAVING A COMMON DRAM BLOCK ACCESSED BY A PLURALITY OF LOGIC CIRCUITS

(75) Inventors: Naoki Kuroda, Kyoto (JP); Yuji Nakai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/074,897

(22) Filed: Mar. 9, 2005

(65) Prior Publication Data

US 2005/0201193 A1    Sep. 15, 2005

(30) Foreign Application Priority Data

Mar. 12, 2004    (JP)    ............................ 2004-071227

(51) Int. Cl.
    *G11C 8/18*    (2006.01)

(52) U.S. Cl. ............ 365/233; 365/230.03; 365/189.08; 365/219

(58) Field of Classification Search ........... 365/230.03, 365/189.08, 233, 219
    See application file for complete search history.

(56) References Cited

U.S. PATENT DOCUMENTS

| | | | |
|---|---|---|---|
| 6,219,072 B1 | 4/2001 | Tanaka et al. | ............... 345/531 |
| 6,646,939 B2 * | 11/2003 | Kwak | .......................... 365/219 |
| 2003/0021175 A1 * | 1/2003 | Kwak | .......................... 365/219 |
| 2003/0202383 A1 | 10/2003 | Shiota et al. | ........... 365/185.33 |

FOREIGN PATENT DOCUMENTS

JP    11-102362    4/1999

OTHER PUBLICATIONS

Hideo Ohwada, et al. "A Single-Chip Band-Segmented-Transmission OFDM Demodulator for Digital Terrestrial Television Broadcasting", 2001 IEEE International Solid-State Circuits Conference, pp. 334-335, 462.

Toshiba Semiconductor Company, "Embedded DRAM technology" <http://www.semicon.toshiba.co.jp/prd/asic/index.html>.

* cited by examiner

*Primary Examiner*—Andrew Q. Tran
(74) *Attorney, Agent, or Firm*—McDermott Will & Emery LLP

(57) ABSTRACT

A plurality of logic circuits access a DRAM block by way of an access circuit. The operation clock for the DRAM block is set at a higher frequency than the system clock for the logic circuits. Outputs of a first bit width from the logic circuits are subjected to serial/parallel conversion into data of a second bit width and the data is written into the DRAM block.

5 Claims, 6 Drawing Sheets

_US 6,990,043 B2_

SEMICONDUCTOR INTEGRATED CIRCUIT DEVICE HAVING A COMMON DRAM BLOCK ACCESSED BY A PLURALITY OF LOGIC CIRCUITS

CROSS-REFERENCE TO RELATED APPLICATION

The disclosure of Japanese Patent Application No. 2004-071227 filed on Mar. 12, 2004 including specification, drawings and claims is incorporated herein by reference in its entirety.

BACKGROUND OF THE INVENTION

The present invention relates to a semiconductor integrated circuit device in which a plurality of logic circuits and a common DRAM block accessed by those logic circuits are incorporated.

Conventionally, memories corresponding to individual logic circuit blocks have been embedded on a system LSI to achieve performance improvement and power consumption reduction. FIG. 6 is a block diagram illustrating an example of a conventional semiconductor integrated circuit device. As shown in FIG. 6, a static random access memory (which will be hereinafter referred to as an "SRAM") 51 having a size ranging from about several kilobits to about several hundred kilobits is used as a storage section for data which is required to be processed at high speed. This is because an SRAM has high random access performance and efficient compilability as well, such that capacity and bit width necessary for data processing can be realized easily. On the other hand, as a storage section for large volume data which does not need high-speed processing and has certain limited patterns, a general dynamic random access memory (which will be hereinafter referred to as a "DRAM") 52 having a size on the order of megabits or more is provided (see non-patent literature 1, for example.)

Meanwhile, DRAMs which are different from general DRAMs have been embedded on an increasing number of system LSIs in order to achieve not only performance increase and power consumption reduction, but also total cost reduction or the like obtainable by optimizing necessary memory capacity to a certain degree (see non-patent literature 2, for example.)

(Non-patent literature 1) Hideo Ohwada and six other persons 'A single-Chip Band-Segmented-Transmission OFDM Demodulator for Digital Terrestrial Television Broadcasting' 2001 IEEE International Solid-State Circuits Conference (Non-patent literature 2) Toshiba Semiconductor Company, 'Embedded DRAM technology' (the search of which was performed on Sep. 25, 2003) Internet <http://www.semicon.toshiba.co.jp/prd/asic/index.html>

SUMMARY OF THE INVENTION

However, the conventional device has the following problems.

In the configuration shown in FIG. 6, for each logic circuit block, one or more SRAMs suitable for a necessary memory space and a necessary number of bits are incorporated by utilizing the efficient compilability of the SRAMs. This permits local optimization of the memory allocation. However, since the capacity of each SRAM is small, even if the ratio of the total memories to the chip becomes too high, the designer of the system LSI is not likely to notice that. Consequently, memory optimization in the entire system LSI is not necessarily performed properly in many cases.

Furthermore, as the scale of system LSI has increased along with performance improvement thereof, the design of respective circuit blocks has been specialized and subdivided year after year. As a result, while the ratio of embedded memories has been increasing, memory optimization in the entire system LSI has become more difficult.

Moreover, an SRAM, whose memory cells each consist of six transistors, is not suited for having a large capacity in terms of integration. Also, if the memory area of an SRAM is increased for a larger capacity, high speed performance, which is an advantage of the SARM, deteriorates. These problems have also presented difficulties in achieving the optimization of entire memories.

On the other hand, a DRAM, whose memory cells each consist of, e.g., a single transistor and a single capacitor, is superior to an SRAM in terms of high integration. Thus, incorporation of DRAMs has also been examined and realized to attain the optimization of entire memories.

However, if a DRAM is provided for each logic circuit, a problem occurs in that the area overhead increases. In view of this, it is considered preferable that a DRAM block is designed so as to be shared by a plurality of logic circuits. However, if a DRAM block is simply shared, data transfer efficiency may deteriorate to cause an accompanying decrease in data processing capability.

In view of the above problems, an object of the present invention is to provide a semiconductor integrated circuit device in which a plurality of logic circuits share a DRAM block without causing any decrease in data processing capability.

An inventive semiconductor integrated circuit device includes: a plurality of logic circuits; a DRAM block; and an access circuit for, upon receipt of an instruction from the logic circuits, accessing the DRAM block by performing time division processing, wherein an operation clock for the DRAM block is set at a higher frequency than an operation clock for the logic circuits.

In the inventive device, since the DRAM block is shared by the plurality of logic circuits, area overhead caused by the peripheral circuits of the memory is reduced, which, in addition to the high degree of integration of the DRAM, permits a further decrease in the device area. Furthermore, the access circuit makes access to the DRAM block by performing time division processing, while the operation clock for the DRAM block is set at a higher frequency than the operation clock for the logic circuits, so that data transfer efficiency equal to, or higher than, that of the conventional configuration is achieved, thereby realizing high data processing capability.

In the inventive semiconductor integrated circuit device, the access circuit preferably includes a serial/parallel conversion circuit, which is provided between the logic circuits and the DRAM block, receives output data from the logic circuits and the DRAM block, converts the number of bits of the received data, and outputs data resulting from the conversion.

In the inventive semiconductor integrated circuit device, in writing output data from the logic circuits into the DARM block, if a destination of the output data is some of entire bits at a write address, the access circuit preferably issues to the DRAM block a write mask command for preventing writing into remaining bit or bits at the write address.

Another inventive semiconductor integrated circuit device includes: first and second logic circuits; a DRAM block; and an access circuit for, upon receipt of an instruction from the first and second logic circuits, accessing the DRAM block by performing time division processing, wherein the access circuit includes: a first serial/parallel conversion circuit, provided between the first logic circuit and the DRAM block, for receiving output data from the first logic circuit and the DRAM block, converting the number of bits of the received data, and outputting data resulting from the conversion, and a second serial/parallel conversion circuit, provided between the second logic circuit and the DRAM block, for receiving output data from the second logic circuit and the DRAM block, converting the number of bits of the received data, and outputting data resulting from the conversion; and the first and second serial/parallel conversion circuits have different conversion rates for converting the number of bits.

In the inventive device, since the DRAM block is shared by the plurality of logic circuits, area overhead caused by the peripheral circuits of the memory is reduced, which, in addition to the high degree of integration of the DRAM, permits a further decrease in the device area. Furthermore, the access circuit makes access to the DRAM block by performing time division processing, while the serial/parallel conversion circuits for converting the number of bits of data are interposed between the logic circuits and the DRAM block. It is thus possible to establish the desired number of I/O bits. In addition, the first and second serial/parallel conversion circuits have different conversion rates for converting the number of bits, so that different numbers of I/O bits can be established for the first and second logic circuits. As a result, the memory space of the DRAM block is used most efficiently, thereby allowing the data region to be flexibly allocated to the logic circuits.

According to the present invention, the device area is reduced further, data transfer efficiency equal to, or higher than, that of the conventional configuration is achieved, and high data processing capability is realized. Moreover, the memory space of the DRAM block is used most efficiently, thereby allowing the data region to be flexibly allocated to the logic circuits.

DESCRIPTION OF THE PREFERRED EMBODIMENTS

Hereinafter, preferred embodiments of the present invention will be described with reference to the accompanying drawings.

Figure 1:
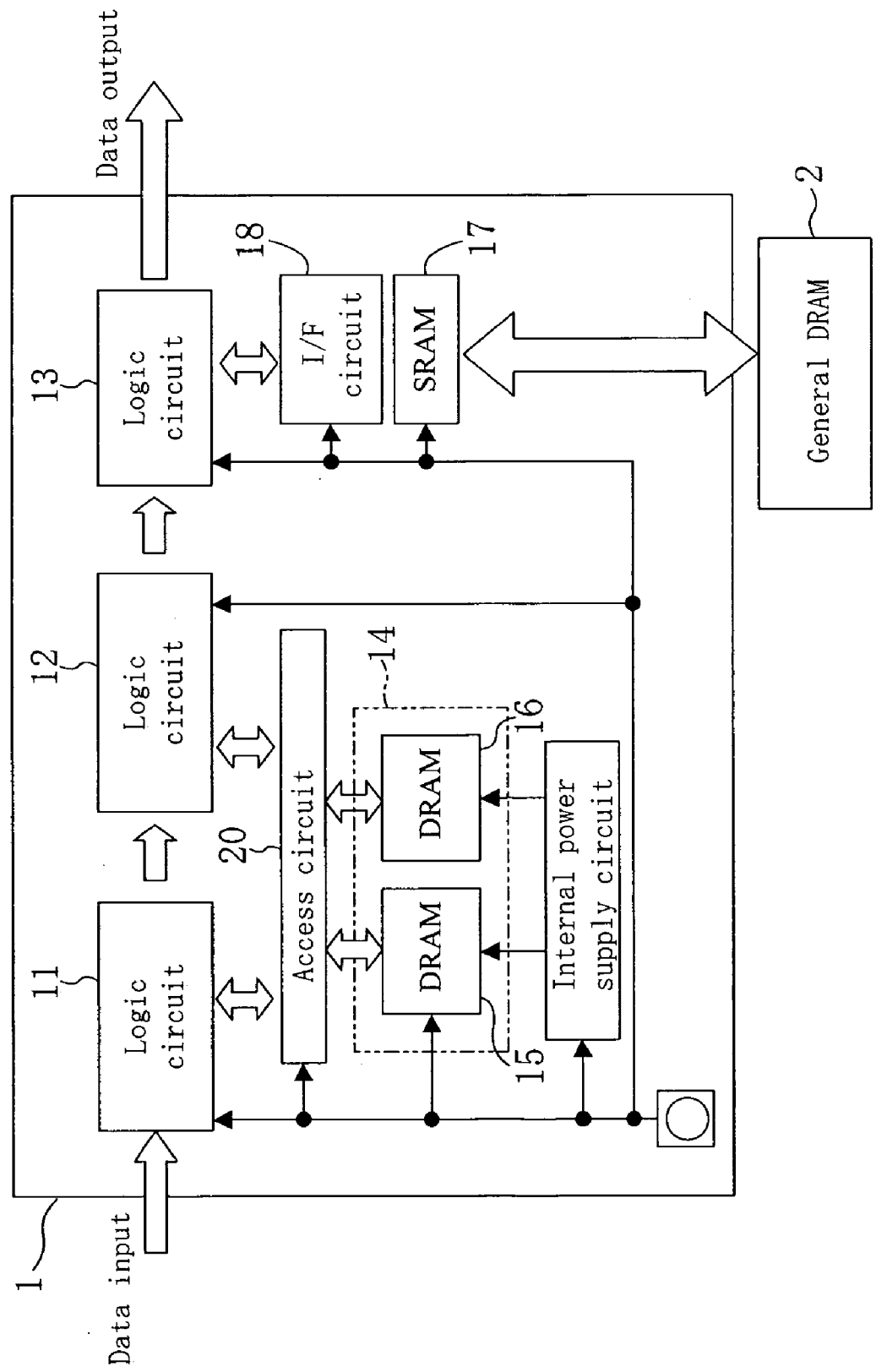
FIG. 1 illustrates the configuration of a semiconductor integrated circuit device in accordance with an embodiment of the present invention.

FIG. 1 is a block diagram illustrating the main components of a semiconductor integrated circuit device in accordance with an embodiment of the present invention. In FIG. 1, the semiconductor integrated circuit device 1 includes a plurality of logic circuits 11, 12, and 13 for realizing respective predetermined processing functions, a DRAM block 14 including two DRAMs 15 and 16, and an SRAM block 17. The DRAM block 14 is accessible from the logic circuits 11 and 12 via an access circuit 20, while the SRAM block 17 is accessible from the logic circuit 13 via an I/F circuit 18. The access circuit 20 is designed so as to be capable of performing time division processing so that the logic circuits 11 and 12 can share the DRAM block 14. The SRAM block 17 is configured capable of transferring data to/from a general DRAM 2.

Figure 2:
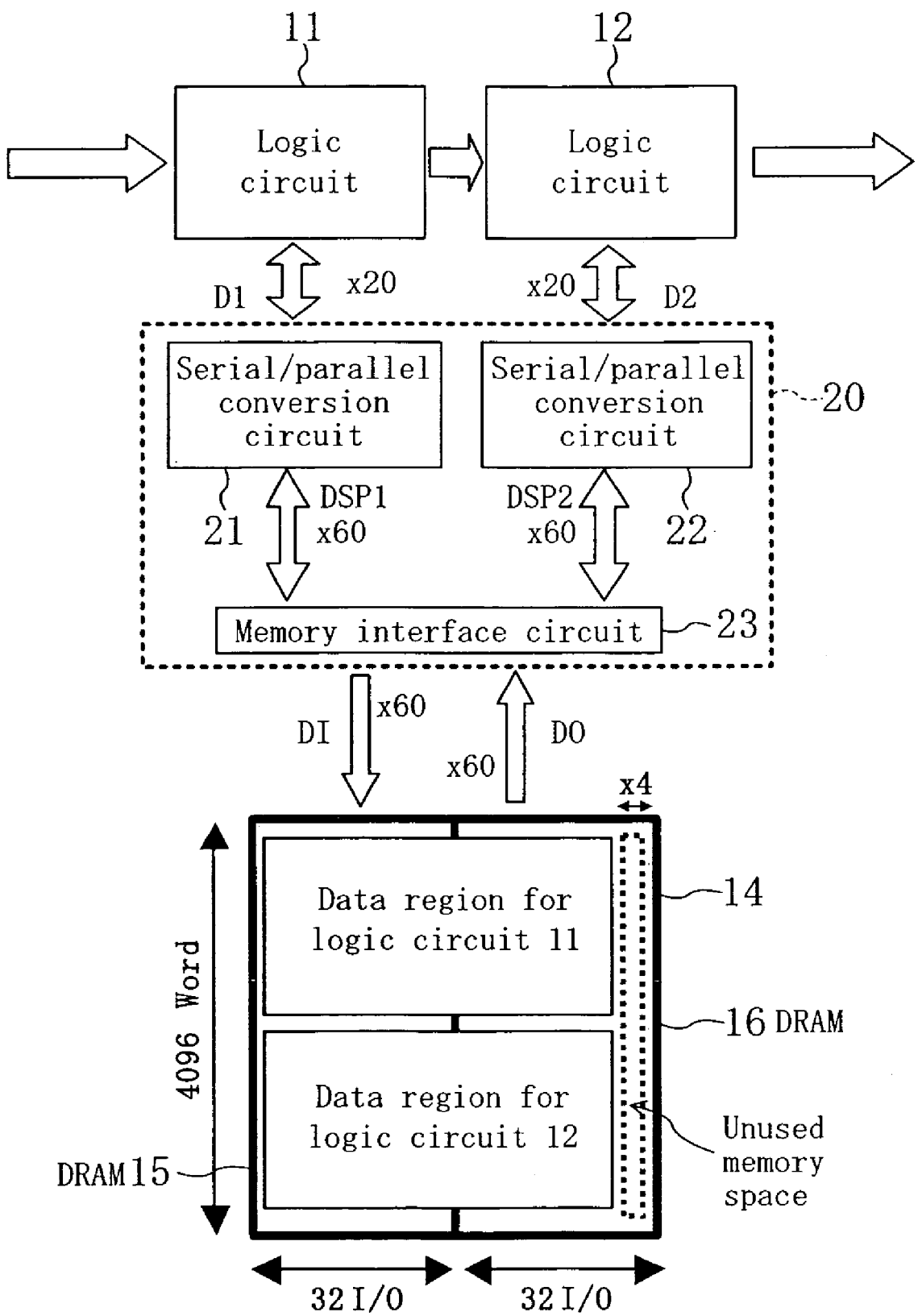
FIG. 2 illustrates the detailed configuration of the peripheral portion of an access circuit shown in FIG. 1.

FIG. 2 illustrates an exemplary detailed configuration of the access circuit 20 and DRAM block 14. In FIG. 2, the DRAM block 14, including the DRAMs 15 and 16 each having a 128-Kbit memory capacity and a 32-bit data I/O, forms a memory space organized as 4,096 words of 60-bit data I/O. This means that 4 bits of the data at each address are not used. The high order 32 bits of the 60-bit data at each address are stored in the DRAM 15, while the low order 28 bits thereof are stored in the DRAM 16.

The logic circuits 11 and 12 output 20-bit data D1 and D2, respectively. In the access circuit 20, serial/parallel conversion circuits 21 and 22 perform serial/parallel conversion of the 20-bit output data D1 and D2 produced from the logic circuits 11 and 12 into 60-bit data DSP1 and DSP2, respectively. And a memory interface circuit 23 supplies the data DSP1 and DSP2 to the DRAM block 14 as input data DI.

The memory interface circuit 23 also provides, as data DSP1 and DSP2, output data DO produced from the DRAM block 14 to the serial/parallel conversion circuits 21 and 22. The serial/parallel conversion circuits 21 and 22 perform parallel/serial conversion of the 60-bit data DSP1 and DSP2 into 20-bit data D1 and D2, respectively. The data D1 and D2 are supplied to the logic circuits 11 and 12.

A feature of this embodiment is that the frequency of the operation clock for the DRAM block 14 is set higher than that of the operation clock for the logic circuits 11 and 12.

Figure 3:
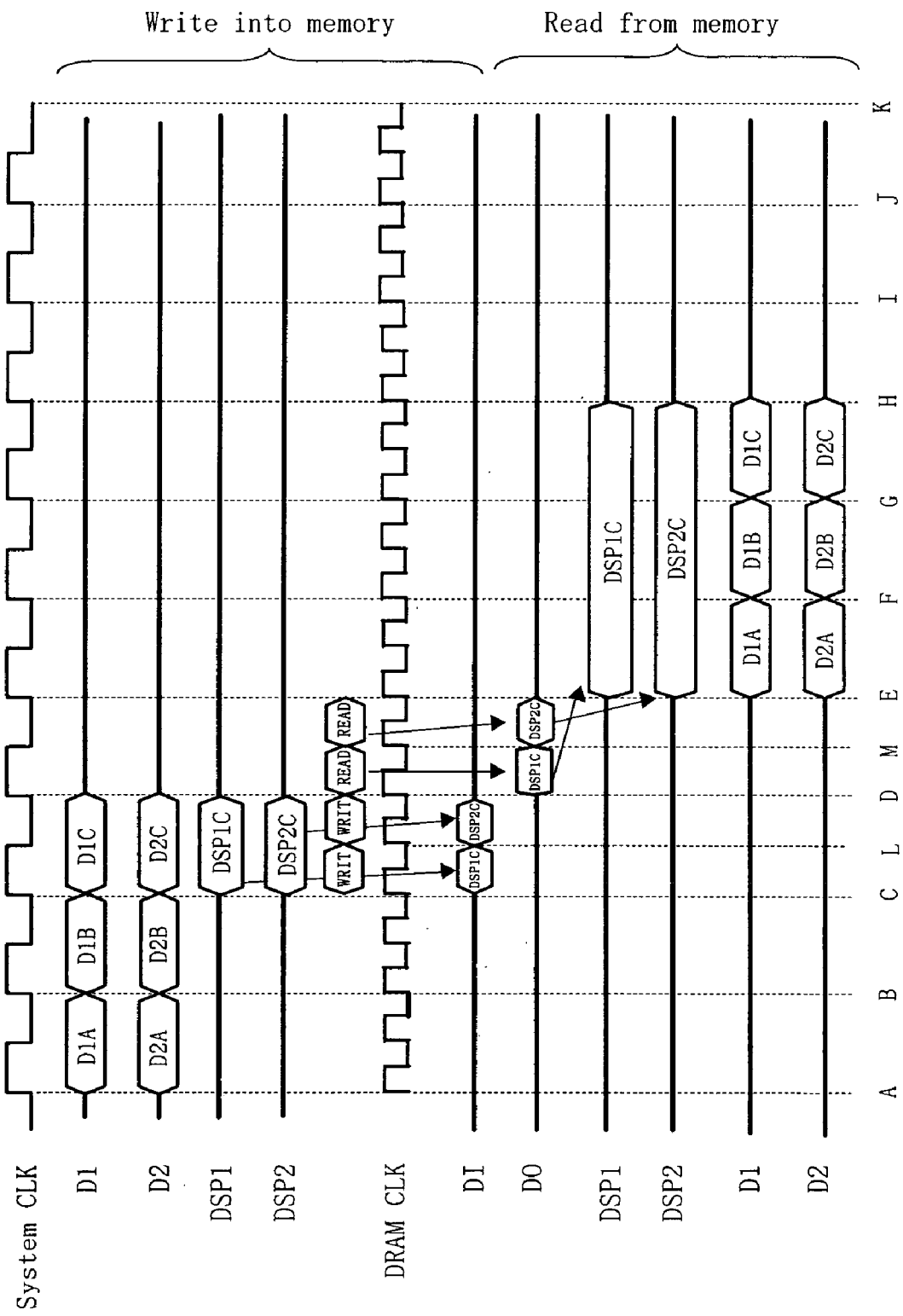
FIG. 3 is a timing chart indicating operation performed by the configuration shown in FIGS. 1 and 2.

Operation performed by the configuration shown in FIG. 2 will be described with reference to a timing chart shown in FIG. 3. It is assumed herein that the operation clock for the DRAM block 14 is set at a frequency twice as high as that of the system clock for operating the logic circuits 11 and 12.

(Data Store)

First, at time A, 20-bit data D1A and D2A are transferred from the logic circuits 11 and 12, respectively, to the serial/parallel conversion circuits 21 and 22 in synchronization with the system clock. Likewise, at time B, 20-bit data D1B and D2B, and at time C, 20-bit data D1C and D2C are transferred from the logic circuits 11 and 12 to the serial/parallel conversion circuits 21 and 22, respectively.

At time C, the serial/parallel conversion circuit 21 performs serial/parallel conversion of the 20-bit data D1A, D1B and D1C transferred by then, into 60-bit data DSP1C. Similarly, at time C, the serial/parallel conversion circuit 22 performs serial/parallel conversion of the 20-bit data D2A, D2B and D2C transferred by then, into 60-bit data DSP2C.

The memory interface circuit 23 writes the 60-bit data DSP1C and DSP2C into the DRAM block 14, formed of the two DRAMs 15 and 16 and having the 60-bit data I/O, in accordance with a DARM clock having a frequency twice as high as that of the system clock. More specifically, at time C, the data DSP1C is first written into the DRAM block 14 by a WRITE command, and at the next clock cycle, i.e., at time L, the remaining data DSP2C is written into the DRAM block 14 by a WRITE command.

(Data Retrieve)

At time D, the memory interface circuit 23 instructs the DRAM block 14 to read the 60-bit data DSP1C by a READ command. At the next clock cycle, that is, at time M, the memory interface circuit 23 also instructs the DRAM block 14 to read the 60-bit data DSP2C by a READ command. In response to this, the data DSP1C and the data DSP2C are transferred from the DRAM block 14 to the memory interface circuit 23 at times D and M, respectively.

Subsequently, at time E, the memory interface circuit 23 transfers the 60-bit data DSP1C and DSP2C to the serial/parallel conversion circuits 21 and 22, respectively, in synchronization with the system clock. The serial/parallel conversion circuit 21 performs parallel/serial conversion of the 60-bit data DSP1C and sequentially transfers to the logic circuit 11 the resultant data, as 20-bit data D1A, D1B and D1C, at times E, F and G, respectively, in synchronization with the system clock. Likewise, the serial/parallel conversion circuit 22 performs parallel/serial conversion of the 60-bit data DSP2C and sequentially transfers to the logic circuit 12 the resultant data, as 20-bit data D2A, D2B and D2C, at times E, F and G, respectively, in synchronization with the system clock.

As described above, in this embodiment, the DRAM block is shared by the plurality of logic circuits, and the access circuit for performing time division multiplex processing is interposed between the logic circuits and the DRAM block. In addition, the DRAM clock is set at a higher frequency than the system clock.

This provides a significant reduction in chip area. DRAMs are simply superior to SRAMs in terms of integration as well. Also, considering that the peripheral circuits of a memory cause area overhead, it is most effective in chip area reduction that a number of small capacity memories is replaced with a small number of relatively large capacity memories ranging from about several ten kilobits to about several hundred kilobits. More specifically, as compared with the conventional configuration in which a one-to-one or one-to-many correspondence is established between a logic circuit and SRAM, the chip area can be reduced more in this embodiment, in which memory integration is achieved and the DRAM block provided is thus smaller in number than the logic circuits.

In the case of a 0.13 $\mu$m process, even if the overhead such as the serial/parallel conversion circuits and the 4-bit unused memory portions are included, the chip area is reduced by about 50% in the configuration of FIG. 2, as compared with the conventional configuration in which each logic circuit is provided with an SRAM.

The configuration of this embodiment also achieves data processing capability as high as, or higher than, that of the conventional configuration. In order to permit a plurality of logic circuits to effectively use a common DRAM block, it is necessary to increase the bandwidth of the DRAM. Therefore, in this embodiment, an operation clock having a frequency higher than the system clock is used to operate the DRAM block 14. In addition, the serial/parallel conversion circuits are disposed between the logic circuits and the DARM block so that a number of data I/Os can be used. In other words, high-performance data processing is realized by access to the DRAM block using the multi-bit data I/Os at a high frequency.

As for power consumption, however, the high-speed operation of the DRAM increases the power consumption required by the configuration of this embodiment. Nevertheless, compared with a configuration in which an SRAM is used in synchronization with the system clock, the power consumption is suppressed in the configuration of this embodiment, because the use of the DRAM, in which the number of included transistors is one sixth of that of the SRAM, allows reduction in the power consumption.

Furthermore, if the number of data sets to be processed in a time-division manner grows further, the bandwidth of the DARM has to be increased. In this case, either the operation frequency of the DARM or the number of data I/Os needs to be increased. However, an increase in the number of data I/Os may destroy the balance with the number of words in terms of the memory capacity, causing an area increase, or may make system operation adjustment for data delay become difficult. In this embodiment, it is therefore preferable to increase the operation frequency of the DRAM.

The following can be said about the capacity of the DRAMs that form the DRAM block. If the DRAM capacity is too large, for example, if the DRAMs have a capacity on the order of megabits, effective allocation of a memory space becomes very difficult. Specifically, an unused excessive memory space such as shown in FIG. 2 increases. Even so, to the ex tent that the DRAMS can have an area advantage over SRAMs, the memory capacity needs to be large enough. In view of this, it is preferable to use DRAMs having a capacity on the order of kilobits ranging from about several ten kilobits to about several hundred kilobits. A DRAM having a capacity on the order of kilobits is sufficiently small in area. With DRAMs having such a capacity, high-speed operation even at 100 MHz or more, for example, is easily achieved, thereby enabling system design in which there is no excessive memory space.

DRAMs, which achieve a high degree of memory cell integration, however, have the disadvantage that incorporation of a refresh circuit, an internal power supply circuit or the like makes their peripheral-circuit ratio high, that is, their memory cell ratio (i.e., memory cell area/DRAM area) is low. Therefore, the capacity of the DRAMs employed in this embodiment, especially, in the case of a capacity on the order of kilobits, needs to be determined by carefully considering a break-even point to the area of SRAM. This is because in order not only to achieve a cost advantage but also to make a DARM as fast as an SARM, which has conventionally been impossible due to memory cell operation, it is necessary to sufficiently decrease the chip area of the DRAM as compared with the SARM. For instance, considering high-speed operation and cost benefits, an optimum capacity is from about 32 kilobits to about 256 kilobits, which allows the DRAM area to be less than half the SRAM area.

Although in this embodiment the DRAM block is accessed from the two logic circuits, the number of logic circuits may be three or more. For example, in a case where three logic circuits access a DRAM block, the operation clock for the DRAM may be raised to three times as high as the system clock, or the number of data I/Os of the DRAM may be increased. Moreover, although in this embodiment the DRAM block is formed of the two DRAMs, the configuration of the DRAM block is not limited to this, but may alternatively be composed of a single DRAM, or three or more DRAMs.

(Modified Example)

Figure 4:
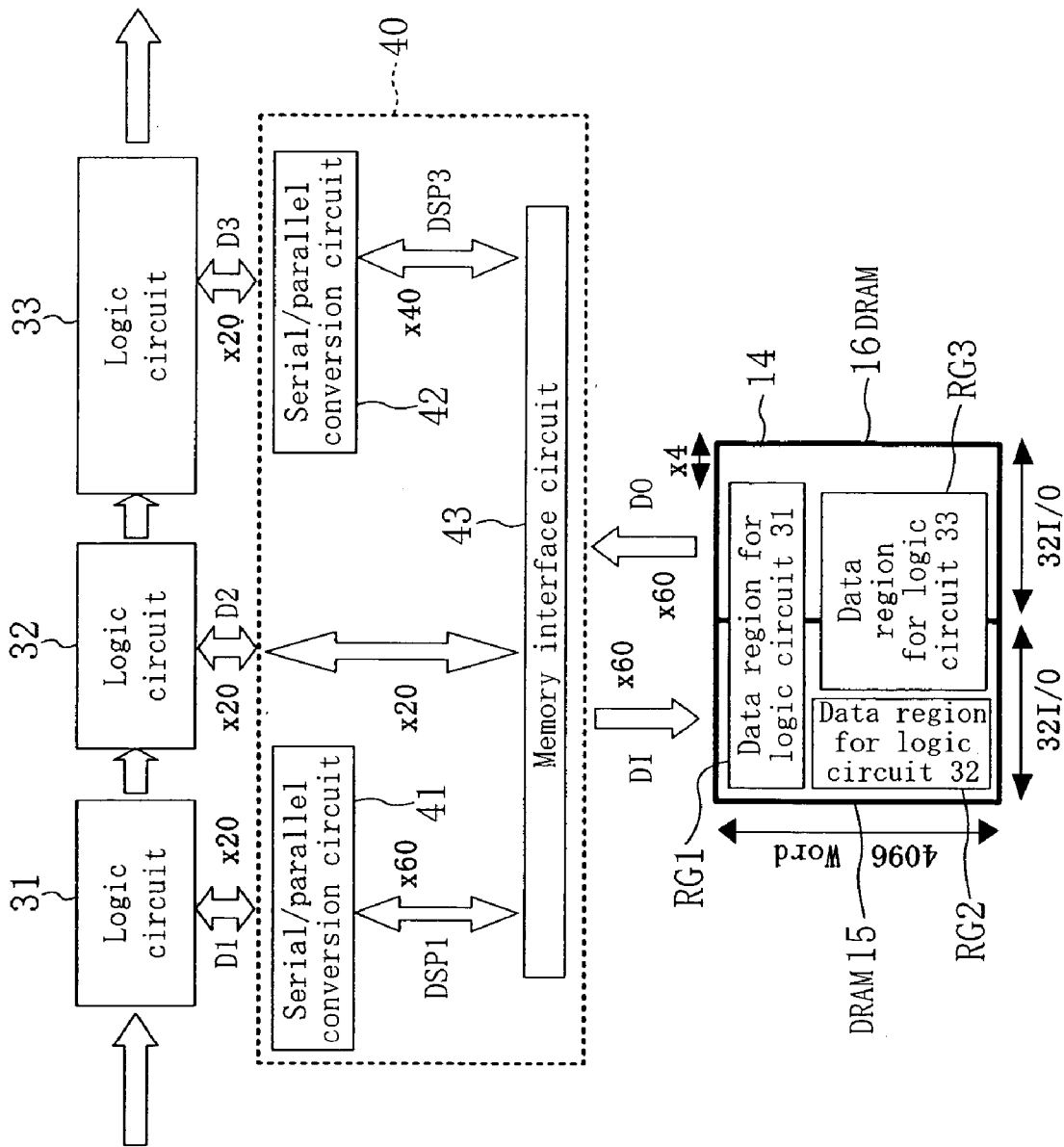
FIG. 4 illustrates the detailed configuration of the peripheral portion of an access circuit according to a modified example of the embodiment of the present invention.

FIG. 4 illustrates the detailed configuration of the peripheral portion of an access circuit 40 in accordance with a modified example of the embodiment of the present invention. In FIG. 4, as in FIG. 2, a DRAM block 14 includes DRAMs 15 and 16, each having a 128-Kbit memory capacity and a 32-bit data I/O, to form a memory space organized as 4,096 words of 60-bit data I/O. That is, 4 bits of the data at each address are not used. The high order 32 bits of the 60-bit data at each address are stored in the DRAM 15, while the low order 28 bits thereof are stored in the DRAM 16.

The configuration of FIG. 4, however, differs from that of FIG. 2 in the way a data region is allocated. In FIG. 4, a 60-bit data region RG1 is allocated to a logic circuit 31, a 20-bit data region RG2 to a logic circuit 32, and a 40-bit data region RG3 to a logic circuit 33. To realize this data-region allocation, first and second serial/parallel conversion circuits 41 and 42, which have different conversion rates for converting the number of bits, are provided in the access circuit 40.

More specifically, the logic circuits 31, 32 and 32 output 20-bit data D1, D2, and D3, respectively. In the access circuit 40, the first serial/parallel conversion circuit 41 performs serial/parallel conversion of the 20-bit output data D1 produced from the logic circuit 31 into 60-bit data DSP1. The second serial/parallel conversion circuit 42 performs serial/parallel conversion of the 20-bit output data D3 produced from the logic circuit 33 into 40-bit data DSP3. And a memory interface circuit 43 supplies the data DSP1, D2, and DSP3 to the DRAM block 14 as input data DI.

The memory interface circuit 43 also supplies, as data DSP1, output data DO from the DRAM block 14 to the serial/parallel conversion circuit 41. The serial/parallel conversion circuit 41 performs parallel/serial conversion of the 60-bit data DSP1 into 20-bit data D1 and supplies the data D1 to the logic circuit 31. The memory interface circuit 43 also provides the logic circuit 32 with the high order 20 bits of the data DO as data D2, while supplying the serial/parallel conversion circuit 42 with the low order 40 bits thereof as data DSP3. The serial/parallel conversion circuit 42 performs parallel/serial conversion of the 40-bit data DSP3 into 20-bit data D3 and supplies the data D3 to the logic circuit 33.

One feature of this modified example is that write mask function is used in writing data into the DRAM block 14. Specifically, in writing the output data D2 from the logic circuit 32, the low order 40 bits of the 60 bits of the data I/O which are not related to the region RG2 are write-masked. On the other hand, in writing the output data D3 from the logic circuit 33, the high order 20 bits of the 60 bits of the data I/O which are not related to the region RG3 are write-masked. The write-mask operation is performed by issuing to the DRAM block 14 a write mask command which specifies the bits into which no data should be written.

Figure 5:
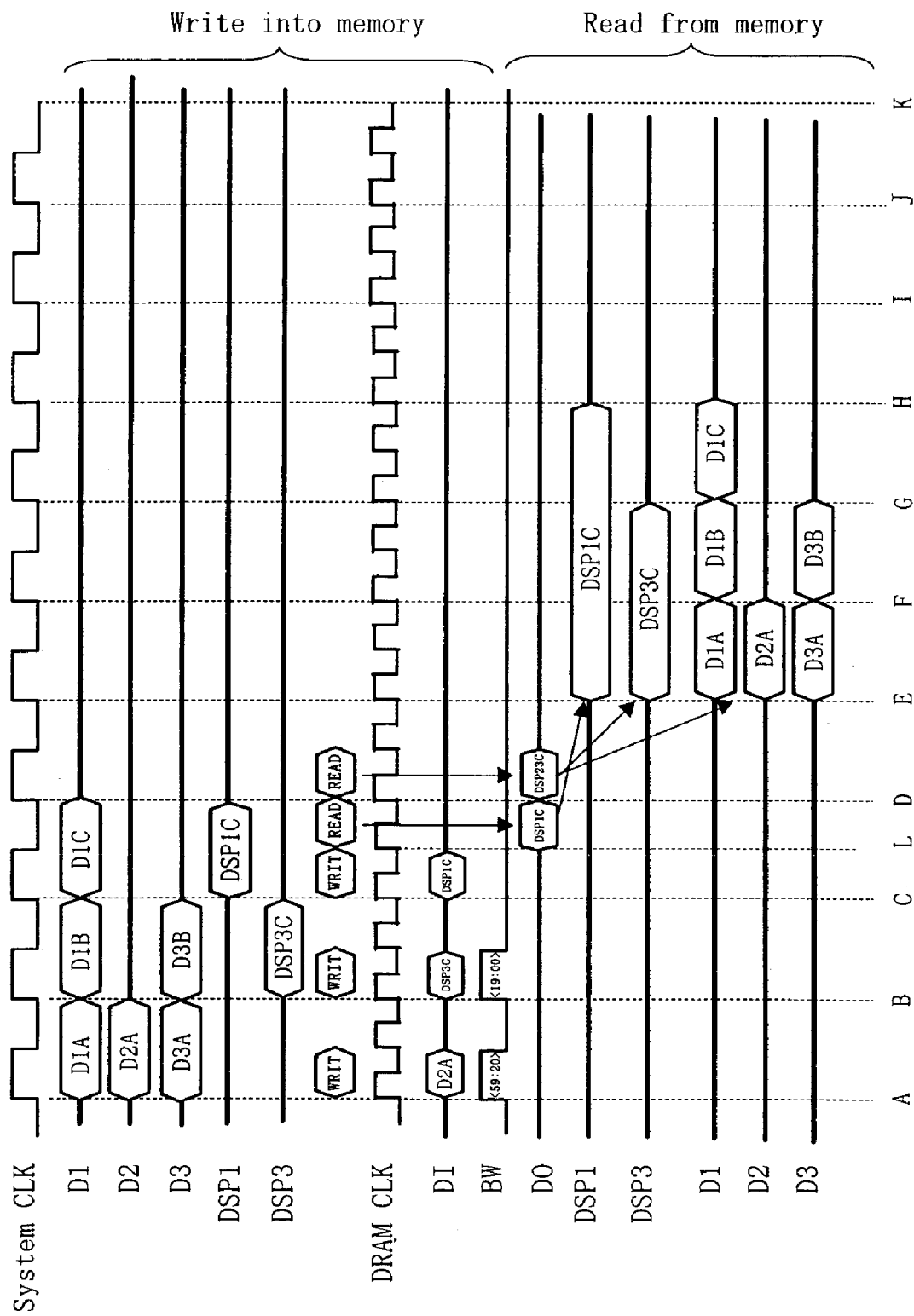
FIG. 5 is a timing chart indicating operation performed by the configuration shown in FIG. 4.
Figure 6:
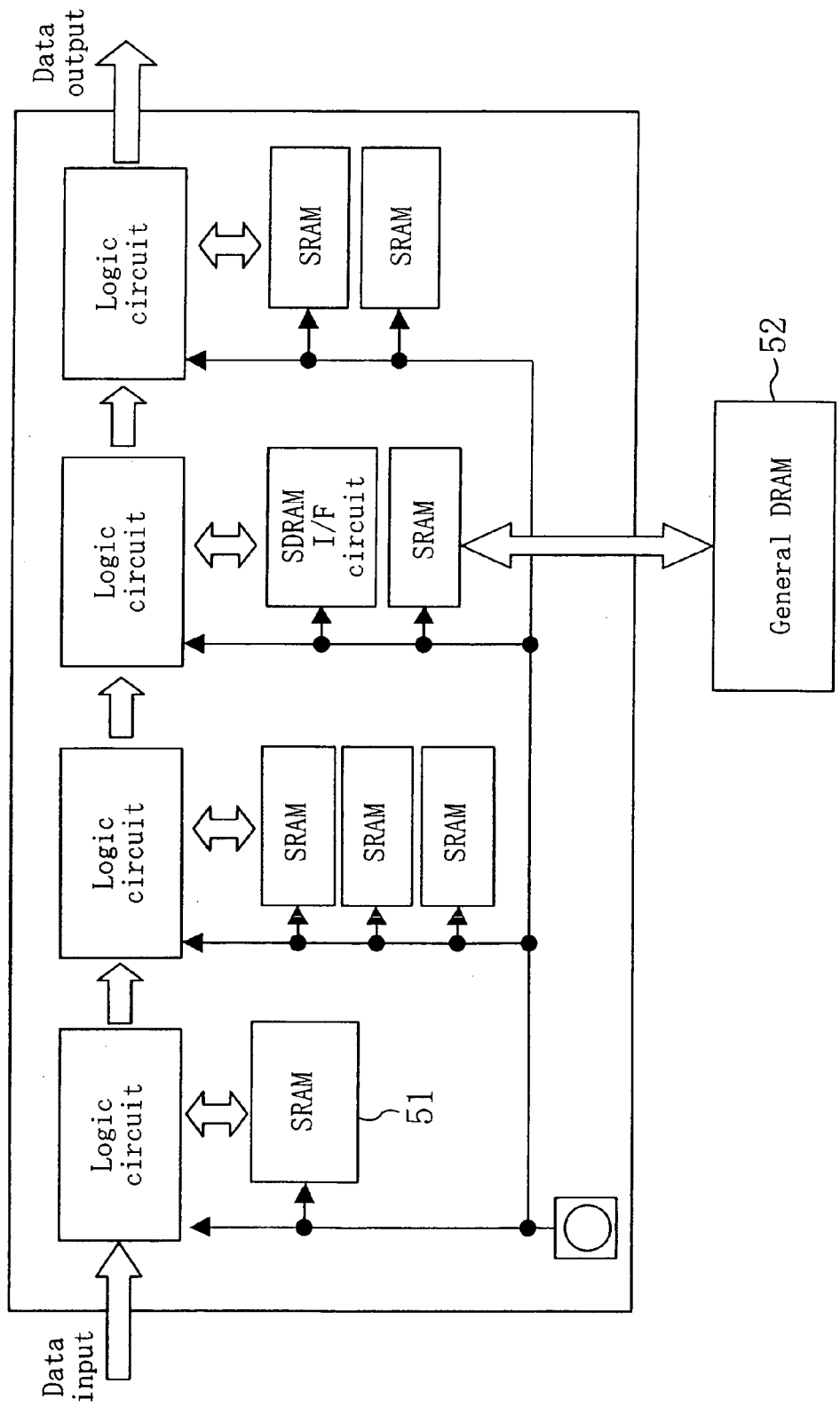
FIG. 6 is a block diagram illustrating the configuration of a conventional semiconductor integrated circuit device.

Operation performed by the configuration shown in FIG. 4 will be described with reference to a timing chart shown in FIG. 5. It is also assumed herein that the operation clock for the DRAM block 14 is limited to a frequency twice as high as that of the system clock for operating the logic circuits 31 through 33.

(Data Store)

First, at time A, 20-bit data D1A, D2A and D3A are transferred from the logic circuits 31, 32 and 33, respectively, to the access circuit 40 in synchronization with the system clock. At this time, the output data D2A from the logic circuit 32 is written as a single unit into the 20-bit width data region RG2 of the DRAM block 14 by the memory interface circuit 43 in synchronization with a DRAM clock. At this time, a write mask command signal BW for preventing writing into the low order 40 bits of the I/O is also output to the DRAM block 14. The output data D1A and D3A from the logic circuits 31 and 33 are stored in the serial/parallel conversion circuits 41 and 42, respectively.

At time B, 20-bit data D1B and D3B are transferred from the logic circuits 31 and 33, respectively, to the access circuit 40. In this operation, the data D1B is stored in the serial/parallel conversion circuit 41, while the data D3B, after stored in the serial/parallel conversion circuit 42, is subjected to serial/parallel conversion together with the data D3A, and then written, as 40-bit data DSP3C, into the 40-bit width data region RG3 of the DRAM block 14. At this time, a write mask command signal BW for preventing writing into the high order 20 bits of the I/O is also output to the DRAM block 14.

At time C, 20-bit data D1C is transferred from the logic circuit 31 to the access circuit 40. After stored in the serial/parallel conversion circuit 41, the data D1C is subjected to serial/parallel conversion together with the data D1A and D1B and then written, as 60-bit data DSP1C, into the 60-bit width data region RG1 of the DRAM block 14.

(Data Retrieve)

At time L, the memory interface circuit 43 instructs the DRAM block 14 to read the 60-bit data DSP1C by a READ command. At the next clock cycle, that is, at time D, the memory interface circuit 43 instructs the DRAM block 14 to read 60-bit data DSP23C by a READ command. In response to this, the data DSP1C and the data DSP23C are transferred from the DRAM block 14 to the memory interface circuit 43 at times L and D, respectively.

Subsequently, at time E, the memory interface circuit 43 transfers the 60-bit data DSP1C to the serial/parallel conversion circuit 41 in synchronization with the system clock. The serial/parallel conversion circuit 43 also divides the 60-bit data DSP23C into 20-bit data D2A and 40-bit data DSP3C and transfers the data D2A and the data DSP3C to the logic circuit 32 and the serial/parallel conversion circuit 42, respectively.

The serial/parallel conversion circuit 41 performs parallel/serial conversion of the 60-bit data DSP1C and sequentially transfers to the logic circuit 31 the resultant data, as 20-bit data D1A, D1B and D1C, at times E, F and G, respectively, in synchronization with the system clock. Likewise, the serial/parallel conversion circuit 42 performs parallel/serial conversion of the 40-bit data DSP3C and sequentially transfers to the logic circuit 32 the resultant data, as 20-bit data D3A and D3B, at times E and F, respectively, in synchronization with the system clock.

As described above, in this modified example, the conversion rates of the serial/parallel conversion circuits are established according to the data regions that the respective logic circuits use. In addition, the write mask function is used to protect data used by the other logic circuits. Therefore, even if accesses are made from the many logic circuits, the memory space of the DRAM block is used most efficiently without casing any deterioration in the data transfer capability. In other words, the flexible allocation of the data region to the logic circuits is easily achieved.

Although in this modified example the DRAM block is accessed from the three logic circuits, the number of logic circuits may be other than three. Moreover, although in this modified example the DRAM block is formed of the two DRAMs, the configuration of the DRAM block is not limited to this, but may alternatively be composed of a single DRAM, or three or more DRAMs.

The present invention provides a significant reduction in the area of a semiconductor, integrated circuit device having logic circuits and a memory block, and is thus effective in achieving performance improvement, and cost reduction obtainable by reducing the chip area of a system LSI, for example.

What is claimed is:

1. A semiconductor integrated circuit device comprising:
   a plurality of logic circuits;
   a DRAM block; and
   an access circuit for, upon receipt of an instruction from the logic circuits, accessing the DRAM block by performing time division processing,
   wherein an operation clock for the DRAM block is set at a higher frequency than an operation clock for the logic circuits.

2. The device of claim 1, wherein the access circuit includes a serial/parallel conversion circuit, which is provided between the logic circuits and the DRAM block, receives output data from the logic circuits and the DRAM block, converts the number of bits of the received data, and outputs data resulting from the conversion.

3. The device of claim 1, wherein in writing output data from the logic circuits into the DRAM block, if a destination of the output data is some of entire bits at a write address, the access circuit issues to the DRAM block a write mask command for preventing writing into remaining bit or bits at the write address.

4. A semiconductor integrated circuit device comprising:
   first and second logic circuits;
   a DRAM block; and
   an access circuit for, upon receipt of an instruction from the first and second logic circuits, accessing the DRAM block by performing time division processing,
   wherein the access circuit includes:
      a first serial/parallel conversion circuit, provided between the first logic circuit and the DRAM block, for receiving output data from the first logic circuit and the DRAM block, converting the number of bits of the received data, and outputting data resulting from the conversion, and
      a second serial/parallel conversion circuit, provided between the second logic circuit and the DRAM block, for receiving output data from the second logic circuit and the DRAM block, converting the number of bits of the received data, and outputting data resulting from the conversion; and
   the first and second serial/parallel conversion circuits have different conversion rates for converting the number of bits.

5. The device of claim 1 or 4, wherein the DRAM block includes a plurality of DRAMs.

* * * * *

UNITED STATES PATENT AND TRADEMARK OFFICE
CERTIFICATE OF CORRECTION

| | | |
|---|---|---|
| PATENT NO. | : 6,990,043 B2 | Page 1 of 1 |
| APPLICATION NO. | : 11/074897 | |
| DATED | : January 24, 2006 | |
| INVENTOR(S) | : Naoki Kuroda et al. | |

It is certified that error appears in the above-identified patent and that said Letters Patent is hereby corrected as shown below:

On the title page,

Item (56) Col. 2 References cited, FOREIGN PATENT DOCUMENTS", change " 11-102362 " to -- 11-102352 --.

Signed and Sealed this

Eleventh Day of July, 2006

JON W. DUDAS
*Director of the United States Patent and Trademark Office*